(12) United States Patent  
Kanbe et al.

(10) Patent No.: US 6,214,445 B1  
(45) Date of Patent: Apr. 10, 2001

(54) PRINTED WIRING BOARD, CORE SUBSTRATE, AND METHOD FOR FABRICATING THE CORE SUBSTRATE

(75) Inventors: Rokuro Kanbe; Yukihiro Kimura; Kouki Ogawa, all of Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 09/459,881

(22) Filed: Dec. 14, 1999

(30) Foreign Application Priority Data

Dec. 25, 1998 (JP) .................................................. 10-376864

(51) Int. Cl.$^7$ ........................................................ B32B 3/00
(52) U.S. Cl. .......................... 428/209; 428/210; 174/250; 174/258; 174/262
(58) Field of Search .................................. 428/209, 210; 174/250, 258, 262

(56) References Cited

U.S. PATENT DOCUMENTS

| Re. 35,064 | * | 10/1995 | Hernandez | 174/256 |
| 4,751,146 | * | 6/1988 | Maeda et al. | 428/461 |
| 5,162,977 | * | 11/1992 | Paurus et al. | 361/401 |
| 5,745,333 | | 4/1998 | Frankeny et al. . | |
| 5,796,587 | * | 8/1998 | Lauffer et al. | 174/255 |
| 5,847,327 | * | 12/1998 | Fischer et al. | 174/256 |
| 5,870,274 | * | 2/1999 | Lucas | 361/311 |
| 5,922,453 | * | 7/1999 | Horn, III et al. | 428/325 |
| 5,962,122 | * | 10/1999 | Walpita et al. | 428/325 |
| 6,068,782 | * | 5/2000 | Brandt et al. | 216/13 |

FOREIGN PATENT DOCUMENTS

| 55-120196 | 3/1979 | (JP) . |
| 62-128597 | 11/1985 | (JP) . |
| 6-14600 | 1/1988 | (JP) . |
| 189998 | 7/1989 | (JP) . |
| 4056308 | 6/1990 | (JP) . |
| 5055751 | 8/1991 | (JP) . |
| 10013033 | 6/1996 | (JP) . |
| 10013036 | 6/1996 | (JP) . |
| 213758 | 8/1996 | (JP) . |
| 10322029 | 5/1997 | (JP) . |

* cited by examiner

Primary Examiner—Cathy Lam  
(74) Attorney, Agent, or Firm—Larson & Taylor, PLC

(57) ABSTRACT

A printed wiring board includes a core substrate, one or more insulating resin layers laminated on at least one side of the core substrate, and a wiring layer formed at least between the core substrate and the insulating resin layer or between the insulating resin layers. The core substrate includes a composite dielectric layer that contains resin and a high-permittivity powder, and a plurality of metal layers disposed such that the composite dielectric layer is sandwiched therebetween. The composite dielectric layer and the metal layers constitute a laminated capacitor.

10 Claims, 17 Drawing Sheets

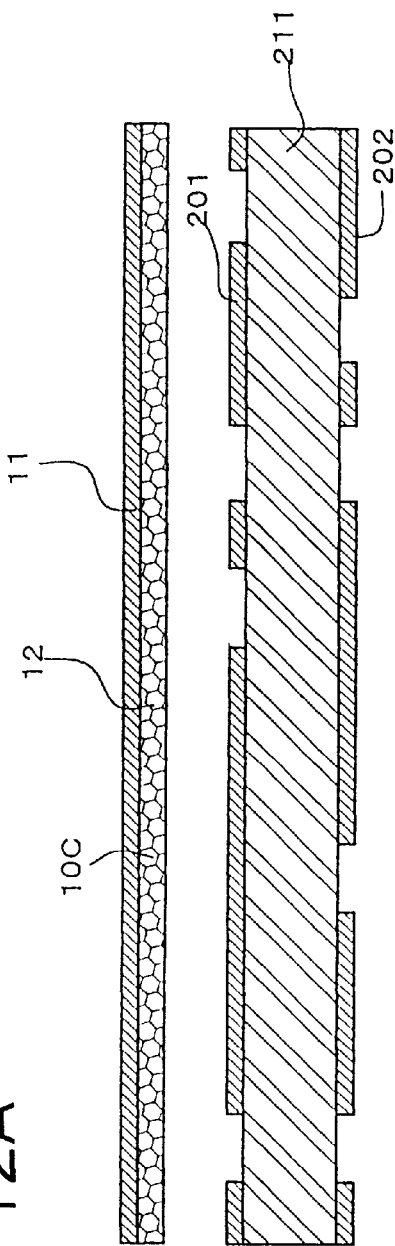
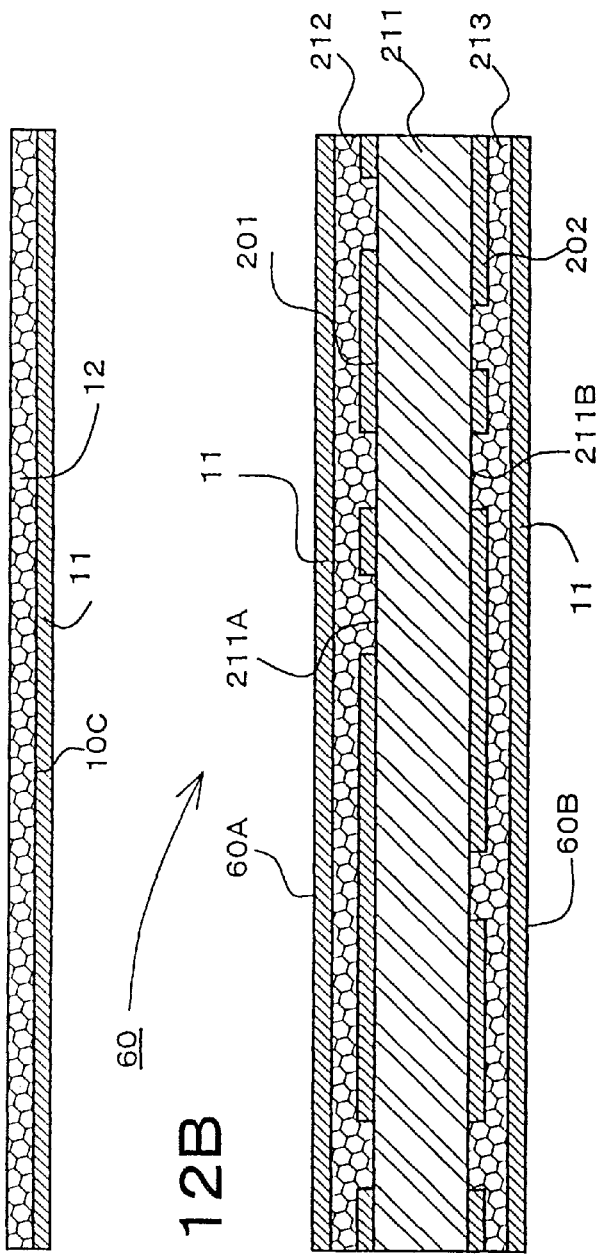
FIG. 12A
FIG. 12B

PRINTED WIRING BOARD, CORE SUBSTRATE, AND METHOD FOR FABRICATING THE CORE SUBSTRATE

BACKGROUND OF THE INVENTION

1. Field of the Invention

The present invention relates to a printed wiring board having a core substrate, and insulating resin layers and wiring layers laminated on opposite sides of the core substrate. More particularly, the invention relates to a printed wiring board having a capacitor incorporated therein.

2. Description of the Related Art

Conventionally, a decoupling capacitor is disposed between a ground line and a power supply line for an IC chip in order to eliminate noise. For example, a chip capacitor is mounted on either side of a printed wiring board. FIG. 17 shows a printed wiring board 300 including a core substrate 310, three insulating resin layers 320, 340, and 360 formed on the front side (upper side in FIG. 17) of the core substrate 310, three insulating resin layers 330, 350, and 370 formed on the back side (lower side in FIG. 17) of the core substrate 310, and wiring layers 315, 325, 345, 335, and 355 sandwiched between the core substrate 310 and the insulating resin layers and between the insulating resin layers. By means of solder SL, a chip capacitor CC is mounted on the wiring layer (pads) 355 located on a back side (lower side in FIG. 17) 300B of the printed wiring board 300. Two electrodes CCA and CCB of the chip capacitor CC are connected to the wiring layer (pads) 345 located on a front side (upper side in FIG. 17) 300A of the printed wiring board 300 through through-hole conductors 316 and the wiring layers 315, 325, 335, and 355.

However, many manhours are required to mount such a chip capacitor on a printed wiring board and connect the same to the printed wiring board. Further, since the chip capacitor is disposed on the back side of the printed wiring board or around an IC chip, the distance between the IC chip and the chip capacitor becomes relatively large, permitting entry of noise into a circuit line extending therebetween.

In order to solve the above problem, a capacitor may be incorporated into a printed wiring board and in the vicinity of an IC chip. The capacitor may be formed within the printed wiring board while a portion of an insulating resin layer is used as a dielectric layer therefor.

When a capacitor including a thin dielectric layer sandwiched between electrode layers having a wide area is formed by an insulating resin layer and wiring layers (for example, the insulating resin layer 320 and the wiring layers 315 and 325 in the printed wiring board of FIG. 17), the capacitor is likely to suffer a short circuit, among other problems, causing a significant decrease in the yield of printed wiring boards. When the capacitor is found to be defective, the insulating resin layers and wiring layers that constitute the capacitor must be disposed of together with the core substrate, and this represents a substantial loss.

SUMMARY OF THE INVENTION

In view of the foregoing, an object of the present invention is to provide a printed wiring board that has a built-in capacitor in the vicinity of an IC chip to be mounted thereon, that can be easily fabricated at high yield, and that can minimize loss due to occurrence of a defective capacitor in the fabrication process.

Another object of the present invention is to provide a core substrate for use in the printed wiring board.

Still another object of the present invention is to provide a method for fabricating the core substrate easily and at low cost.

To achieve the above objects, the present invention provides a printed wiring board comprising a core substrate, at least one insulating resin layer laminated on at least one side of the core substrate, and a wiring layer formed at least between the core substrate and the insulating resin layer or between the insulating resin layers, the core substrate comprising a composite dielectric layer that contains resin and a high-permittivity powder; and a plurality of metal layers disposed to sandwich the composite dielectric layer therebetween to thereby form a laminated capacitor.

According to the printed wiring board of the present invention, the core substrate includes a laminated capacitor formed of the composite dielectric layer and the metal layers. Thus, the capacitor having a large capacitance can be disposed in the vicinity of an electronic component, such as an IC chip, thereby effectively eliminating noise. Since the laminated capacitor is incorporated in the core substrate, the core substrate may be inspected for the characteristics of, and any defect (such as a short circuit) in, the laminated capacitor. Only those core substrates that have passed the inspection may be sent to a step of fabricating printed wiring boards; in other words, insulating resin layers and wiring layers may be formed on an accepted core substrate to thereby yield a printed wiring board. Thus, printed wiring boards can be fabricated at high yield. When the built-in capacitor is found defective due to, for example, a short circuit, only the bare core substrate is disposed of, before the insulating resin layers and wiring layers are formed thereon, thereby minimizing loss. Therefore, the corresponding printed wiring boards can be fabricated at low cost.

Preferably, in order to permit access, on a surface of the core substrate, to an electrical potential of metal layers serving as electrodes of the laminated capacitor, a through-hole conductor connected electrically to selected metal layers is formed in the core substrate. In other words, the through-hole conductor is preferably electrically connected to predetermined ones of the above-mentioned plurality of metal layers other than a metal layer located on the surface of the core substrate to thereby permit access, on the surface of the core substrate, to an electrical potential of the predetermined interior metal layers. A manner of connecting the through-hole conductor and the predetermined metal layers may be determined according to other circuit lines formed on the printed wiring board such as signal circuit lines and the required type and number of power supply and ground lines.

Circuit lines extending from the metal layers of the laminated capacitor to the surface of the printed wiring board on which electronic components are mounted may include a stacked via. The reason for this is that the shorter and the thicker the circuit lines extending between an electronic component, such as an IC chip, and the electrodes (metal layers) of the capacitor, the lower the inductance of the circuit lines, thereby suppressing noise entry into the lines.

The resin to be contained in the composite dielectric layer may be selected in view of permittivity, heat resistance, and other properties. Examples of usable resins include epoxy resin, polyimide resin and BT resin. The high-permittivity powder to be contained in the composite dielectric layer may be of a substance having high permittivity; for example, a high-permittivity ceramic, such as $BaTiO_3$, $PbTiO_3$, $PbZrO_3$, $Pb(Ti,Zr)O_3$ (so-called PZT), $Pb(Mn,Nb)O_3$, $SrTiO_3$, $CaTiO_3$, or $MgTiO_3$. Further, the addition of a metal powder of, for example, Ag, Au, Cu, Ag—Pd, Ni, W, or Mo, may increase the permittivity of the composite dielectric layer.

The present invention further provides a core substrate which is used to fabricate a printed wiring board through lamination of one or more insulating resin layers and wiring layers on at least one side of the core substrate. The core substrate comprises at least one composite dielectric layer that contains resin and high-permittivity powder; and a plurality of metal layers disposed to sandwich the composite dielectric layer therebetween to thereby form a laminated capacitor.

A capacitor is likely to suffer a defect, such as a short circuit. According to the present invention, the capacitor is incorporated in the core substrate, thereby enabling the laminated capacitor to be inspected for capacitance and any defect, such as a short circuit, upon completion of the core substrate. Therefore, only those core substrates that conform to predetermined criteria are used in a further step of fabricating printed wiring boards, thereby increasing the yield of printed wiring boards. When the laminated capacitor is found defective due to, for example, a short circuit or insufficient capacitance, the bare core substrate itself may simply be disposed of, before the insulating resin layers and wiring layers are formed thereon, thereby minimizing loss.

Preferably, in order to permit access, on a surface of the core substrate, to an electrical potential of metal layers serving as electrodes of the laminated capacitor, a through-hole conductor connected electrically to selected metal layers is formed in the core substrate. In other words, the through-hole conductor is preferably electrically connected to predetermined ones of the above-mentioned plurality of metal layers other than a metal layer located on the surface of the core substrate to thereby permit access, on the surface of the core substrate, to an electrical potential of the predetermined interior metal layers. A manner of connecting the through-hole conductor and the predetermined metal layers may be determined according to other circuit lines formed on the printed wiring board, such as signal circuit lines and the required type and number of power supply and ground lines.

The present invention still further provides a method for fabricating a core substrate comprising at least one composite dielectric layer, which contains a semi-cured resin and a high-permittivity powder, and a plurality of metal layers disposed to sandwich the composite dielectric layer to thereby form a laminated capacitor. The method comprises the steps of: forming a first three-layer film comprising, in order, a metal foil, a semi-cured composite dielectric layer, and a reinforcement film, the semi-cured composite dielectric layer containing a semi-cured resin and a high-permittivity powder; forming at least one patterned three-layer film in comprising, in order, a metal foil formed in a predetermined pattern, a semi-cured composite dielectric layer, and a reinforcement film, the semi-cured composite dielectric layer containing a semi-cured resin and a high-permittivity powder; laminating a single two-layer film obtained through removal of the reinforcement film from the first three-layer film and at least one patterned two-layer film obtained through removal of the reinforcement film from the patterned three-layer film such that the semi-cured composite dielectric layers and the patterned metal foil are arranged alternately in layers while the metal foil of the two-layer film is positioned so as to be an outermost layer, placing a metal foil on the opposite outermost semi-cured composite dielectric layer of the resultant laminar structure, and thermally pressing the laminar structure to yield a laminate; forming a plurality of through-holes in the laminate such that the through-holes extend from one side of the laminate to the other side of the laminate; and forming a through-hole conductor on walls of the through-holes and forming a metal layer on opposite sides of the laminate.

According to the method of the present invention for fabricating a core substrate, the three-layer film and the patterned three-layer film are prepared in advance. The two-layer film (obtained through removal of the reinforcement film from the first three-layer film), the patterned two-layer film (obtained through removal of the reinforcement film from the patterned three-layer film), and the metal foil are arranged in layers and thermally pressed together into a laminate. There is no need for sequentially forming composite dielectric layers and metal layers, as is required in the case of forming a conventional built up multilayer printed wiring board. Therefore, the process for fabricating the core substrate is simple and short, thereby reducing the cost of fabricating the core substrate.

The reinforcement film of the first three-layer film and that of the patterned three-layer film facilitate handling of the composite dielectric layers and the (patterned) metal foils. Even when the metal foil and the (semi-cured) composite dielectric layer are rendered thinner, ease of handling effected by the reinforcement film facilitates the fabrication of the core substrate. Further, the reinforcement film, which covers the semi-cured dielectric layer, prevents adhesion of dust which would otherwise result from stickiness of the semi-cured composite dielectric layer, and thus prevents the occurrence of a defect caused by such dust.

Notably, the above-mentioned step of forming the three-layer film may comprise the steps of: applying to a metal foil a green composite dielectric layer that contains a resin and a high-permittivity powder; affixing a reinforcement film to the green composite dielectric layer; and rendering the resin semi-cured through application of heat to thereby form the three-layer film. In this case, the above-mentioned step of forming the patterned three-layer film comprises an additional step of pattering the metal foil into a predetermined pattern. Since the composite dielectric paste is applied to the metal foil, the three-layer film or the laminate enjoys good adhesion between the (patterned) metal foil and the composite dielectric layer, and hardly any air or dust enters therebetween, thereby preventing occurrence of a defect such as would otherwise result from trapped air or dust.

An adhesive may be employed for lamination. Specifically, the above-described step for forming the laminate may comprise the steps of: arranging the semi-cured composite dielectric layers and the patterned metal foils alternately in layers while a adhesive layer is sandwiched therebetween and the metal foil of the two-layer film is positioned so as to be an outermost layer; placing a metal foil on the opposite outermost semi-cured composite dielectric layer of the resultant laminar structure while an adhesive layer is sandwiched therebetween, and thermally pressing the laminar structure to yield the laminate. The resultant laminate enjoys reliable adhesion between the composite dielectric layers and the metal foils. It is noted that a laminate which does not employ the adhesive layers provides a larger capacitance in the laminated capacitor than a laminate which employs the adhesive layers.

The present invention still further provides a core substrate which is used to fabricate a printed wiring board through lamination of one or more insulating resin layers and wiring layers on at least one side of the core substrate.

The core substrate comprises a center substrate; at least one composite dielectric layer that contains resin and a high-permittivity powder; and a plurality of metal layers disposed to sandwich the composite dielectric layer to thereby form a laminated capacitor on at least one side of the center substrate.

The core substrate of the present invention has the laminated capacitor formed on at least one side of the center substrate. Thus, the capacitor can be disposed in the vicinity of an electronic component, such as an IC chip, thereby effectively eliminating noise. Since the laminated capacitor is incorporated in the core substrate, the core substrate may be inspected for the characteristics of, and any defect, such as a short circuit, in, the laminated capacitor. Only those core substrates that have passed the inspection are sent to a step of fabricating printed wiring boards. Thus, printed wiring boards can be fabricated at high yield. When the laminated capacitor is found defective due to, for example, a short circuit, only the bare core substrate need be disposed of, and this occurs before the insulating resin layers and wiring layers are formed thereon, thereby minimizing loss.

Preferably, in order to permit access, on a surface of the core substrate, to an electrical potential of metal layers serving as electrodes of the laminated capacitor, a through-hole conductor connected electrically to the metal layers is formed in the core substrate. A manner of connecting the through-hole conductor and the metal layers may be determined according to other circuit lines formed on the printed wiring board such as signal circuit lines and the required type and number of power supply and ground lines.

Material for the center substrate may be selected in consideration of heat resistance, mechanical strength, flexibility, and workability, among other properties. Examples of the material include a glass-fiber-resin composite material composed of glass fiber, such as glass fabric or unwoven glass fabric, and resin, such as epoxy resin, polyimide resin, or BT resin; a composite material composed of resin and organic fiber such as polyamide fiber; and a resin-resin composite material formed through impregnation of a three-dimensional network fluorine resin, such as continuously porous PTFE, with resin, such as epoxy resin.

The present invention still further provides a method for fabricating a core substrate comprising a center substrate, a composite dielectric layer that contains resin and a high-permittivity powder, and a plurality of metal layers disposed to sandwich the composite dielectric layer to thereby form a laminated capacitor on at least one side of the center substrate. The method comprises the steps of: forming a first three-layer film comprising, in order, a metal foil, a semi-cured composite dielectric layer, and a reinforcement film, the semi-cured composite dielectric layer containing a semi-cured resin and a high-permittivity powder; placing a two-layer film obtained through removal of the reinforcement film from the three-layer film on a center substrate having a metal layer of a predetermined pattern on at least one side thereof such that the semi-cured composite dielectric layer of the two-layer film is layered on the metal layer of the center substrate, and thermally pressing a resultant laminar structure to yield a laminate; forming a plurality of through-holes in the laminate such that the through-holes extend from one side of the laminate to the other side of the laminate; and forming a through-hole conductor on walls of the through-holes and forming a metal layer on opposite sides of the laminate.

According to the method of the present invention for fabricating a core substrate, the first three-layer film is prepared in advance. The two-layer film obtained through removal of the reinforcement film from the three-layer film is placed on at least one side of the center substrate in layers. The resultant laminar structure is thermally pressed into a laminate. There is no need for sequentially forming composite dielectric layers and metal layers on one side of the center substrate, as is required in the case of forming a built up multilayer printed wiring board. Therefore, the process for fabricating the core substrate is simplified and short in duration, thereby reducing the cost of fabricating the core substrate.

The reinforcement film of the three-layer film facilitates handling of the composite dielectric layer and the metal foil. Even when the metal foil and the (semi-cured) composite dielectric layer are rendered thinner, ease of handling effected by the reinforcement film facilitates the fabrication of the core substrate. The reinforcement film, which covers the semi-cured dielectric, prevents adhesion of dust which would otherwise result from stickiness of the semi-cured composite dielectric layer, and thus prevents the occurrence of any defect caused by such dust.

Notably, the above-mentioned step of forming the three-layer film may comprise the steps of: applying to a metal foil a green composite dielectric layer that contains a resin and a high-permittivity powder; affixing a reinforcement film to the green composite dielectric layer; and rendering the resin semi-cured through application of heat to thereby form the three-layer film. Since the composite dielectric paste is applied to the metal foil, the three-layer film or the laminate enjoys good adhesion between the metal foil and the composite dielectric layer, and substantially no air or dust enters therebetween to thereby prevent occurrence of defects such as would otherwise result from trapped air or dust.

The present invention still further provides a method for fabricating a core substrate comprising a center substrate, a composite dielectric layer that contains resin and a high-permittivity powder, and a plurality of metal layers disposed to sandwich the composite dielectric layer therebetween to thereby form a laminated capacitor on at least one side of the center substrate. The method comprises the steps of: forming a three-layer film comprising, in order, a metal foil, a semi-cured composite dielectric layer, and a reinforcement film, the semi-cured composite dielectric layer containing a semi-cured resin and a high-permittivity powder; forming at least one patterned three-layer film in which a metal foil formed in a predetermined pattern, a semi-cured composite dielectric layer, and a reinforcement film are layered in this order, the semi-cured composite dielectric layer containing a semi-cured resin and a high-permittivity powder; placing at least one patterned two-layer film obtained through removal of the reinforcement film from the patterned three-layer film on a center substrate having a metal layer of a predetermined pattern on at least one side thereof such that the semi-cured composite dielectric layer of the patterned two-layer film is superposed on the metal layer or the patterned metal foil, placing on an outermost patterned metal foil a single two-layer film obtained through removal of the reinforcement film from the first three-layer film such that the semi-cured composite dielectric layer of the two-layer film is superposed on the outermost patterned metal foil, and thermally pressing the resultant laminar structure to yield a laminate; forming a plurality of through-holes in the laminate such that the through-holes extend from one side of the laminate to the other side of the laminate; and forming a through-hole conductor on walls of the through-holes and forming a metal layer on the opposite sides of the laminate.

According to the method of the present invention for fabricating a core substrate, the three-layer film and the patterned three-layer film are prepared in advance. The patterned two-layer film (obtained through removal of the reinforcement film from the patterned three-layer film) and the two-layer film (obtained through removal of the reinforcement film from the three-layer film) are placed on at least one side of the center substrate, in layers. The resultant laminar structure is thermally pressed into a laminate. There is no need for sequentially forming composite dielectric layers and metal layers on one side of the center substrate, as is required in the case of forming a buildup multilayer printed wiring board. Therefore, the process for fabricating the core substrate becomes simple and short, thereby fabricating the core substrate at low cost. Through employment of lamination of the two-film layer and the patterned two-film layers, the resultant laminated capacitor enjoys a large capacitance.

The reinforcement film of the first three-layer film and that of the patterned three-layer film facilitate handling of the composite dielectric layers and the (patterned) metal foils. Even when the metal foil and the (semi-cured) composite dielectric layer are rendered thinner, ease of handling effected by the reinforcement film facilitates the fabrication of the core substrate. The reinforcement film, which covers the semi-cured dielectric layer, prevents adhesion of dust which would otherwise result from stickiness of the semi-cured composite dielectric layer, and thus preventing occurrence of defects caused by such dust.

BRIEF DESCRIPTION OF THE DRAWINGS

Various other objects, features and many of the attendant advantages of the present invention will be readily appreciated as the same become better understood by reference to the following detailed description of the preferred embodiments when considered in connection with the accompanying drawings, in which:

FIGS. 3A–8 are sectional views showing a method of fabricating the core substrate and the printed wiring board according to the first embodiment, wherein FIG. 3A shows the step of forming a composite dielectric layer on a copper foil, FIG. 6 shows the step of forming through-holes in the laminate shown in FIG. 5B, FIG. 7 shows the step of filling through-holes formed in the through-hole conductors of the core substrate shown in FIG. 1 with resin and forming conductors at the upper and lower ends of the through-holes to thereby close the through-holes, and FIG. 8 shows the steps of forming insulating resin layers and wiring layers on the upper and lower sides of the core substrate shown in FIG. 7;

FIGS. 12A–15 are sectional views showing a method of fabricating the core substrate and the printed wiring board according to the second embodiment, wherein FIG. 12A shows the step of placing two-layer films, obtained through removal of reinforcement films from the three-layer films, on opposite sides of the center substrate shown in FIG. 11, FIG. 12B shows the step of pressing the laminar structure shown in FIG. 12A to obtain a laminate, FIG. 13 shows the step of forming through-holes in the laminate shown in FIG. 12B, FIG. 14 shows the step of filling through-holes formed in the through-hole conductors of the core substrate shown in FIG. 9 with resin and forming conductors at the upper and lower ends of the through-holes to thereby close the through-holes, and FIG. 15 shows the steps of forming insulating resin layers and wiring layers on the upper and lower sides of the core substrate shown in FIG. 14;

DESCRIPTION OF THE PREFERRED EMBODIMENTS

First Embodiment

Figure 1:
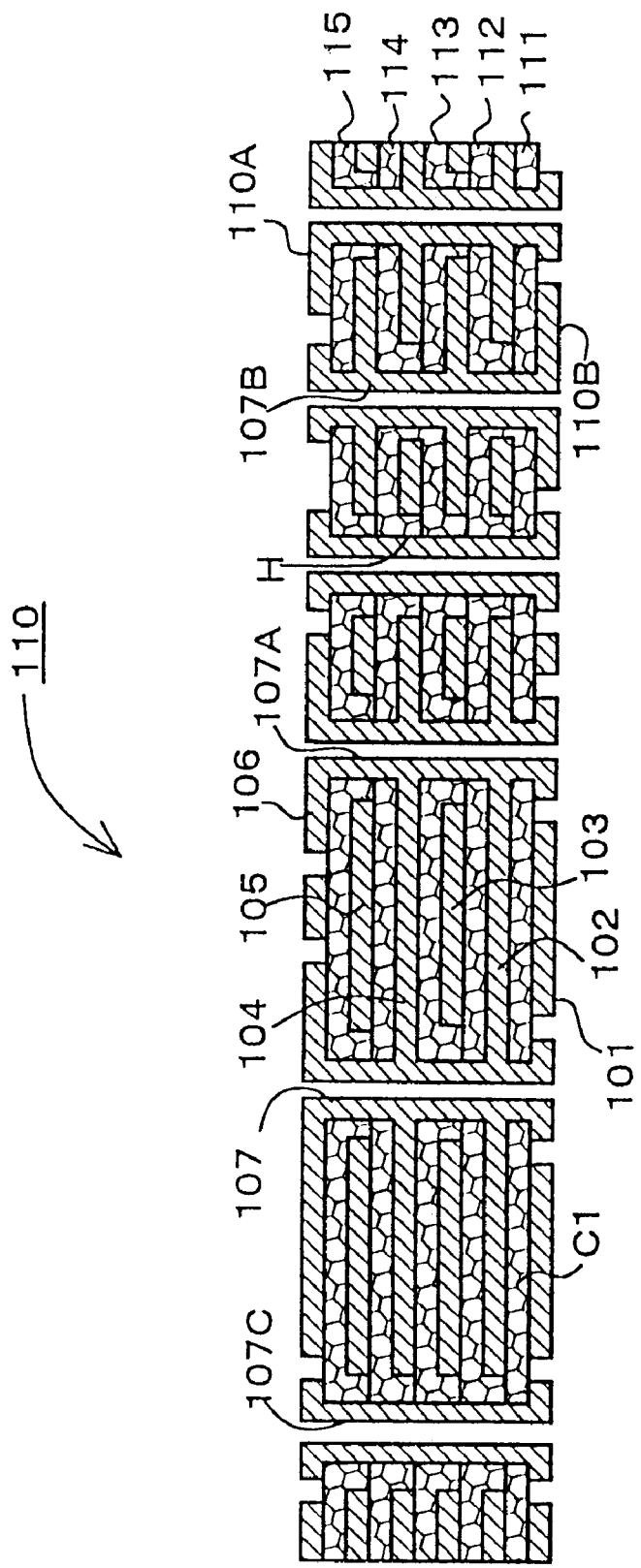
FIG. 1 is a partially enlarged sectional view showing a core substrate according to a first embodiment of the present invention.

A first embodiment of the present invention will next be described in detail with reference to the drawings. A core substrate 110 shown in FIG. 1 includes five composite dielectric layers 111–115, metal layers 101–106 of Cu, and through-hole conductors 107 of Cu. The metal layers 101–106 are disposed between the composite dielectric layers 111–115, on the lower surface (in FIG. 1) of the composite dielectric layer 111, and on the upper surface (in FIG. 1) of the composite dielectric layer 115. The through-hole conductors 107 are each formed on the wall of a through-hole H. The composite dielectric layers 111–115 and the metal layers 101–106 constitute a laminated capacitor C1 having 5 dielectric layers. Among the interior metal layers 102–105, those having a common electric potential (for example, the metal layers 103 and 105 or the metal layers 102 and 104) are electrically connected to the metal layer 106 on a front surface 110A of the core substrate 110 or the metal layer 101 on a back surface 110B of the core substrate 110 by means of, for example, a first through-hole conductor 107A or a second through-hole conductor 107B. The exterior metal layers 101 and 106 serve as electrodes of the laminated capacitor C1 and as wiring layers.

A certain through-hole conductor 107, such as a third through-hole conductor 107C, is not electrically connected to the interior metal layers 102–105 so as to be used as, for example, a signal circuit line. As described above, electrical continuity is established between the metal layers 102 and 104 and the metal layer 106 and between the metal layers 103 and 105 and the metal layer 101. Accordingly, through alternating arrangement of metal layers (101–106) and composite dielectric layers (111–115), the laminated capacitor C1 is implemented.

The composite dielectric layers 111–115 each have a thickness of 50 m and are made of a ceramic-metal-resin composite material. The composite material is prepared through dispersion of 30 vol % $BaTiO_3$ and 20 vol % Cu powder into epoxy resin. Containing $BaTiO_3$ having high permittivity (relative permittivity $\epsilon_r$=approx. 18000) and Cu powder, the composite material exhibits higher permittivity ($\epsilon_r$=30) than does a conventional resin. Accordingly, the laminated capacitor C1 incorporated in the core substrate 110 assumes a relatively large capacitance (3.0 nF).

Next, a printed wiring board 100 will be described. The printed wiring board 100 shown in FIG. 2 includes the core substrate 110; three insulating resin layers 121, 141, and 161 and two wiring layers 125 and 145 formed on the front surface 110A of the core substrate 110; and three insulating resin layers 131, 151, and 171 and two wiring layers 135 and 155 formed on the back surface 110B of the core substrate 110. The wiring layers 125, 145, 135, and 155 are disposed between the insulating resin layers 121, 141, 161, 131, 151, and 171 and include via conductors 125V, 145V, 135V, and 155V, respectively, adapted to establish electrical connection to the corresponding metal layers or wiring layers located underneath. The through-hole conductors 107 formed in the core substrate 110 are filled with a plug material 116 of epoxy resin and are closed by means of block portions 101C and 106C formed on the metal layers 101 and 106, respectively.

As easily understood from the above description, the printed wiring board 100 integrally contains the laminated capacitor C1 formed in the core substrate 110. Accordingly, an IC chip (not shown) mounted on the front surface (component side) 100A of the printed wiring board 100 is located in the vicinity of the laminated capacitor C1, whereby a connecting circuit line for connecting the IC chip and the laminated capacitor C1 becomes very short, thereby reliably eliminating noise. Among the wiring layers 125, 145, 135, and 155, signal circuit lines can have a conventional circuit line width and can be routed in a conventional manner in contrast to the case where high permittivity is imparted to the insulating resin layers 121, 141, 161, 131, 151, and 171. Since the insulating resin layers 121, 141, 161, 131, 151, and 171 can be formed of a conventional epoxy resin, their permittivity remain unchanged, and thus the impedance of signal circuit lines remains unchanged. Accordingly, wiring layers including signal wiring layers can be easily designed.

Figure 3A:
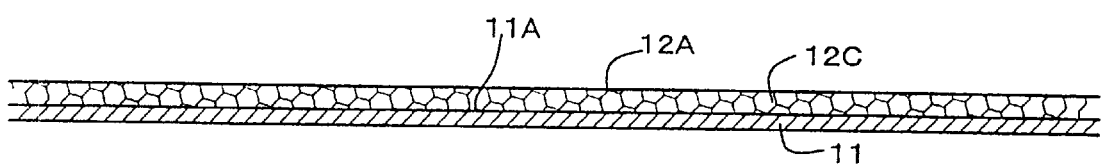

Next, the method for fabricating the core substrate 110 will be described. First, a step of forming a three-layer film will be described. A composite dielectric paste is prepared through dispersion of $BaTiO_3$ powder and Cu powder into an epoxy paste. As shown in FIG. 3A, the composite dielectric paste is applied to an upper surface 11A of a copper foil 11 having a thickness of 18 μm so as to form a paste layer having a thickness of 10–100 μm (about 60 μm in the present embodiment), yielding a green composite dielectric layer 12C. Subsequently, the green composite dielectric layer 12C is dried at a temperature of 50° C. for 60 minutes in order to increase viscosity while surface stickiness is maintained.

Next, a reinforcement film RF made of polyimide or polyester and having a thickness of 200 μm is affixed to a surface 12A of the green composite dielectric layer 12C. The resulting layered film is heated at a temperature of 80° C. for 60 minutes, thereby yielding a three-layer film 10 having the copper foil 11, a semi-cured composite dielectric layer 12, and the reinforcement film RF arranged in layers in this order. Since the three-layer film 10 is reinforced by means of the reinforcement film RF, even when the copper foil 11, a patterned copper foil 21 or 31 (described later), and the semi-cured composite dielectric layer 12 are thin, the three-layer film 10 has sufficient rigidity to endure handling during fabrication of the core substrate 110 shown in FIG. 1 having thin metal layers 101, etc., and composite dielectric layers 111, etc. Since the semi-cured composite dielectric layer 12 having some stickiness is sandwiched between the copper foil 11 and the reinforcement film RF, adhesion of dust to the semi-cured composite dielectric layer 12 is prevented. Further, since the composite dielectric paste is applied to the copper foil 11 to thereby form the green composite dielectric layer 12C, no air or dust is caught between the copper foil 11 and the semi-cured composite dielectric layer 12, thereby establishing good adhesion therebetween. Preferably, the upper surface 11A of the copper foil 11 is roughened previously through, for example, black oxide treatment, acicular plating, or etching in order to further improve adhesion between the copper foil 11 and the semi-cured composite dielectric layer 12.

Figure 4A:
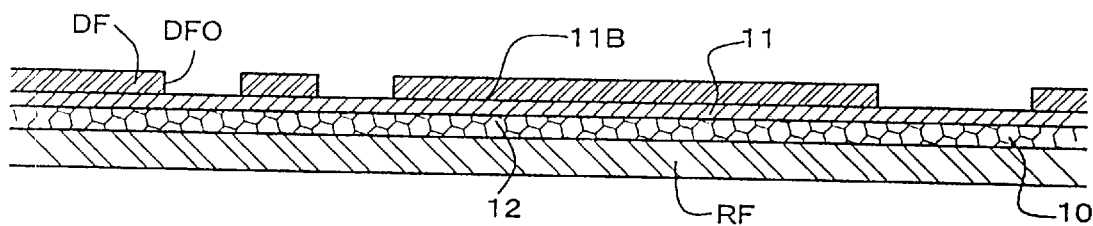
FIG. 4A shows the step of etching resist of a predetermined pattern is formed on the copper foil.
Figure 4B:
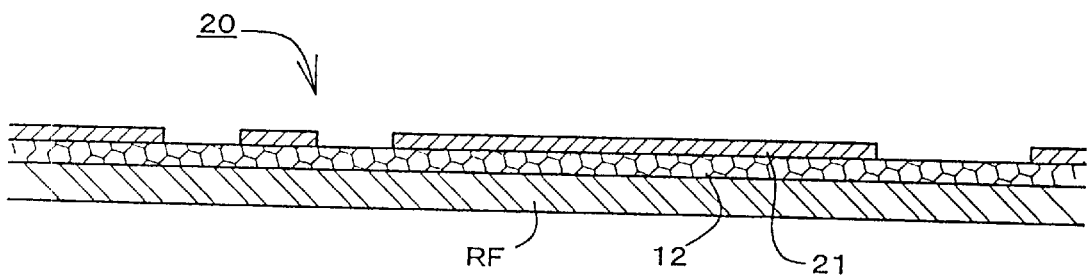
FIG. 4B shows the step of etching the copper foil into a predetermined pattern.
Figure 4C:
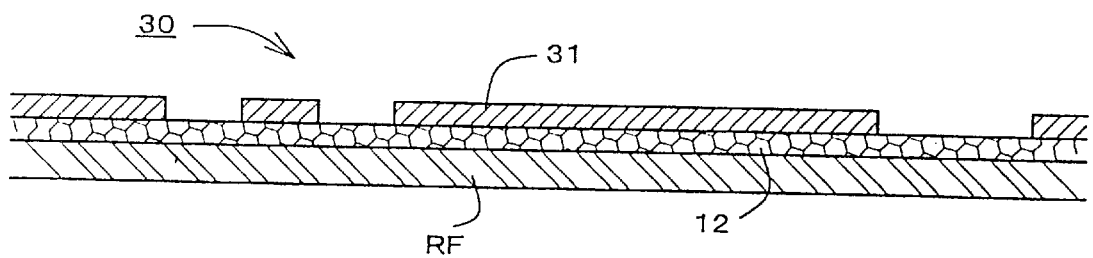
FIG. 4C shows the step of etching the copper foil into a predetermined pattern different from that of FIG. 4B.

Next, a step of forming a patterned three-layer film will be described. As shown in FIG. 4A, a dry film DF is affixed to an exposed surface 11B (upper surface in FIG. 4A) of the copper foil 11 of the three-layer film 10, followed by exposure and development to thereby form an opening DFO of a predetermined pattern. Then, as shown in FIG. 4B, the copper foil 11 is etched into a first patterned copper foil 21 of a predetermined pattern. The dry film DF is removed from the first patterned copper foil 21, yielding a first patterned three-layer film 20. Similarly, as shown in FIG. 4C, a second patterned three-layer film having a second patterned copper foil 31 is formed. Preferably, the exposed surface of the patterned copper foil 21 (31) is roughened through, for example, black oxide treatment, acicular plating, or etching, thereby improving adhesion between the patterned copper foil 21 (31) and the adjacent semi-cured composite dielectric layer 12 in the subsequent lamination step.

Figure 3B:
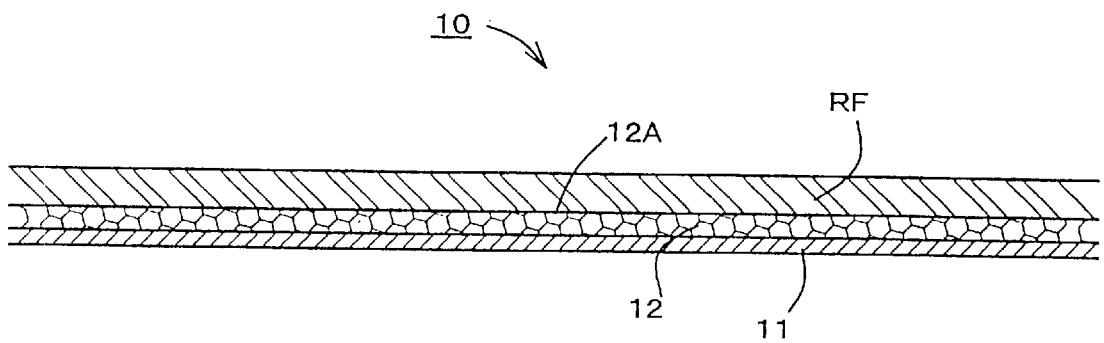
FIG. 3B shows the step of affixing a reinforcement film to the composite dielectric layer to complete a three-layer film.
Figure 5A:
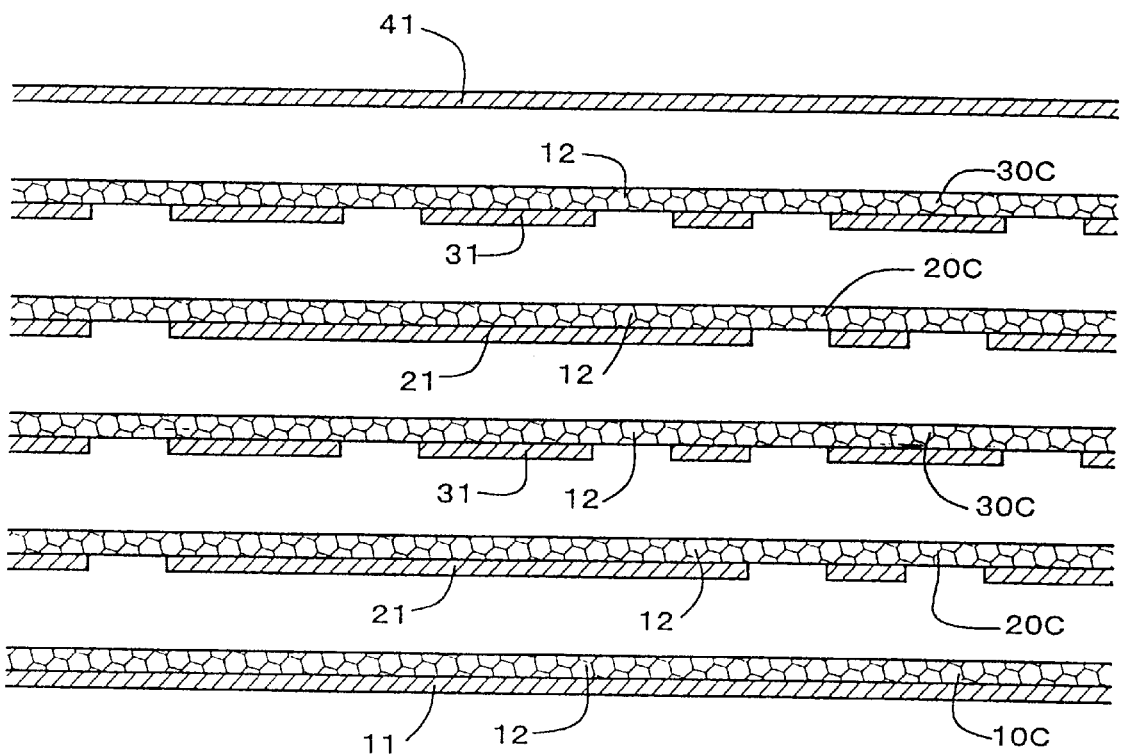
FIG. 5A shows the step of stacking two-layer films, obtained through removal of reinforcement films from the three-layer films shown in FIGS. 3B, 4B, and 4C.
Figure 5B:
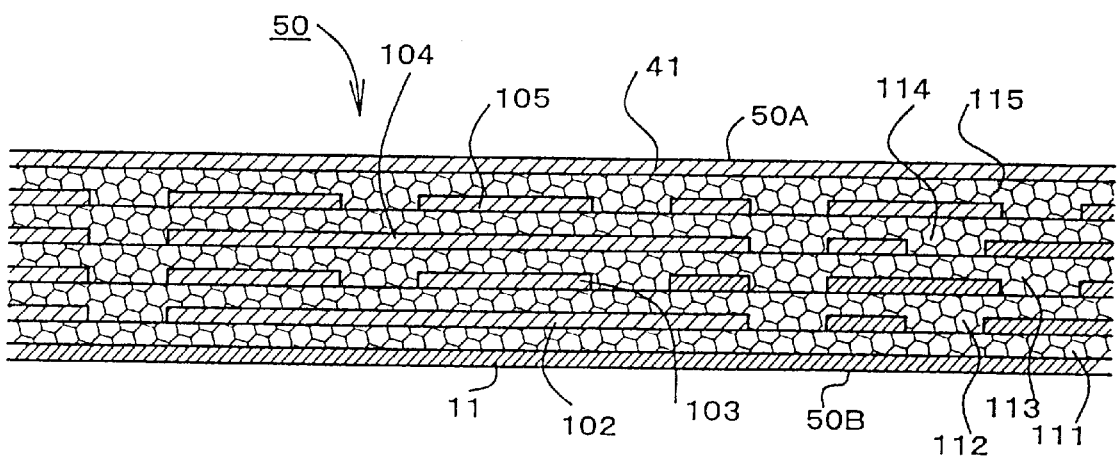
FIG. 5B shows the step of pressing the laminar structure of FIG. 5A to obtain a laminate.

In the subsequent lamination step, as shown in FIG. 5A, a two-layer film 10C obtained through removal of the reinforcement film RF from the three-layer film 10 shown in FIG. 3B and the first and second patterned three-layer films 20C and 30C obtained through removal of the reinforcement films RF from the first and second patterned three-layer films 20 and 30, respectively, are arranged in layers in this order while the copper foil 11 of the two-layer film 10C becomes a bottom layer. In other words, the semi-cured composite dielectric layer 12 and the patterned copper foils 21 and 31 are arranged in an alternating manner in layers. In the present embodiment, the two first patterned two-layer films 20C and the two second patterned two-layer films 30C are arranged alternatingly in layers. A copper foil 41 having a thickness of 18 μm is placed on the top semi-cured composite dielectric layer 12. The resultant laminar structure is thermally pressed in the vertical direction of FIG. 5A in a vacuum at a temperature of 180° C. and a pressure of 30 kg/cm² for 2 hours so as to cure epoxy resin of the composite dielectric layers 12, thereby yielding a laminate 50 shown in FIG. 5B. In the laminate 50, the five composite dielectric layers 111–115 and the metal layers 102–105 patterned as designed are arranged alternatingly in layers and the copper foils 11 and 41 form a back surface 50A and a front surface 50B, respectively.

Figure 6:
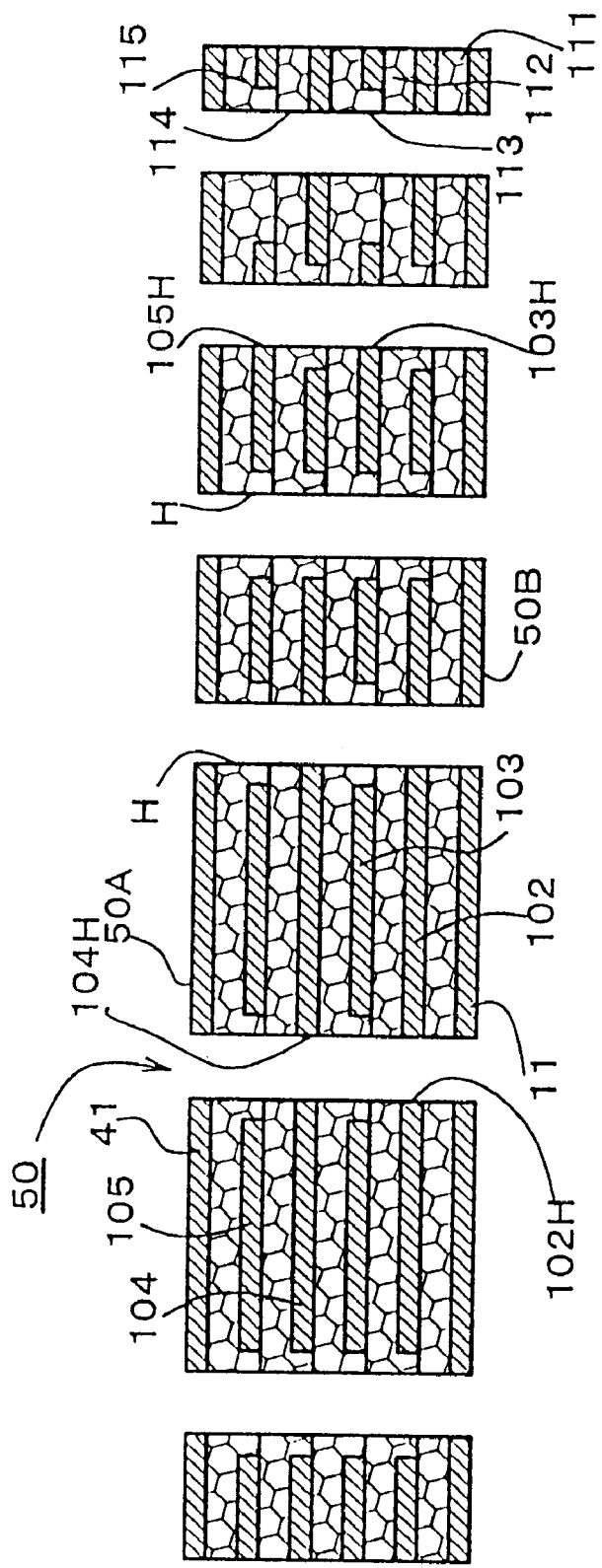

In the subsequent step of forming through-holes, as shown in FIG. 6, through-holes H having a diameter of 60 μm are formed in the laminate 50 at predetermined positions in such a manner as to extend between the front surface 50A and the back surface 50B, by use of a fourth harmonic of a YAG laser. End faces 102H and 104H of the metal layers 102 and 104 or end faces 103H and 105H of the metal layers 103 and 105 are exposed on the walls of some through-holes H. The through-holes H may be formed by means of a third harmonic of a YAG laser, $CO_2$ laser, or drilling, depending on, for example, a through-hole diameter and materials for the laminate.

In the step of forming a metal layer on the front and back surfaces 50A and 50B of the laminate 50, the through-hole conductors 107 are formed on the corresponding walls of the through-holes H by a known PTH process. Also, through utilization of the copper foils 11 and 41, the metal layers 101 and 106 having predetermined patterns are formed, thus completing the core substrate 110 (see FIG. 1). Notably, among the through-hole conductors 107, for example, the first and second through-hole conductors 107A and 107B are electrically connected to the end faces 102H and 104H of the metal layers 102 and 104 and the end faces 103H and 105H of the metal layers 103 and 105, respectively. Thus, as mentioned previously, electrical continuity is established between the metal layers 102 and 104 serving as opposite electrodes of the laminated capacitor C1 and the metal layers 106 and 101 formed on the front and back surfaces 110A and 110B, respectively, via the first and second through-hole conductors 107A and 107B.

The core substrate 110 is inspected for a short circuit in, and the insulation resistance of, or capacitance of, the laminated capacitor C1. For example, when the laminated capacitor C1 suffers a short circuit caused by a short circuit between the metal layers 102 and 103 or fails to exhibit a capacitance falling within a predetermined range, the core substrate 110 is disposed of as a defective core substrate. The larger the capacitance of a capacitor, the more noise elimination capability improves. Accordingly, a higher capacitance is preferred. Conceivable measures to increase the capacitance include the following: the thickness of the composite dielectric layers 111–115 is reduced; the area of the core substrate 110 (specifically, the area of the metal layers) is increased; and the metal powder (such as copper powder) content of the composite dielectric layers 111–115 is increased in order to increase the permittivity of the composite dielectric layers 111–115.

However, these measures are likely to cause a short circuit in the laminated capacitor C1, potentially resulting in a reduced yield of the core substrates 110. The present embodiment enables the core substrate 110 to be readily checked for conditions of the laminated capacitor C1. If the laminated capacitor C1 is found defective, the bare core substrate 110 can be disposed of before the insulating resin layers and wiring layers are formed thereon. Therefore, the printed wiring board 100 in process of or after fabrication is less likely to suffer a defective laminated capacitor C1, so that the fabrication of the printed wiring boards 100, which will be described later, is less likely to suffer a reduction in yield caused by occurrence of a defective laminated capacitor C1 and a loss caused by disposal of the printed wiring boards 100 having a defective laminated capacitor C1.

Figure 7:
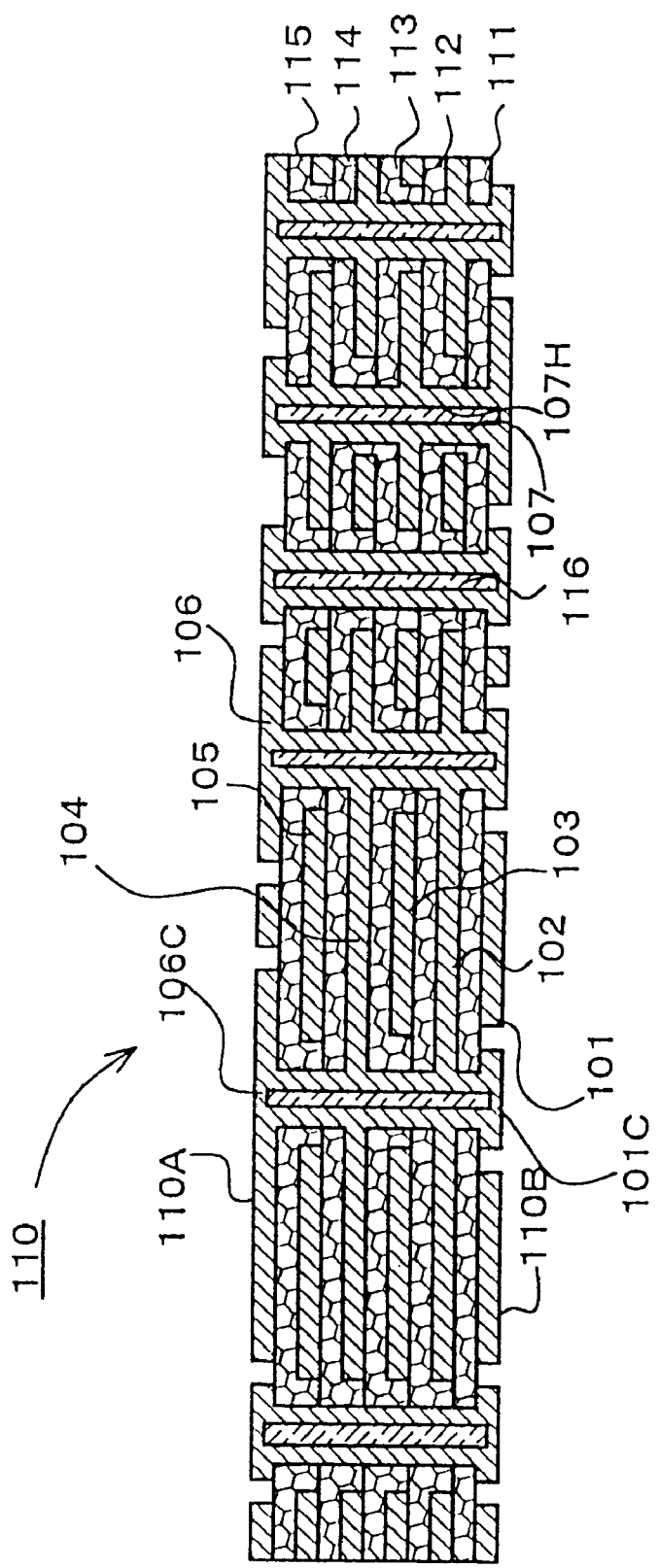

The core substrate 110 may be formed into the printed wiring board 100 by a known process. Specifically, as shown in FIG. 7, through-holes 107H formed in the corresponding through-hole conductors 107 are filled with the plug material 116 of epoxy resin and are closed by the block portions 101C and 106C, which are formed by plating.

Figure 8:
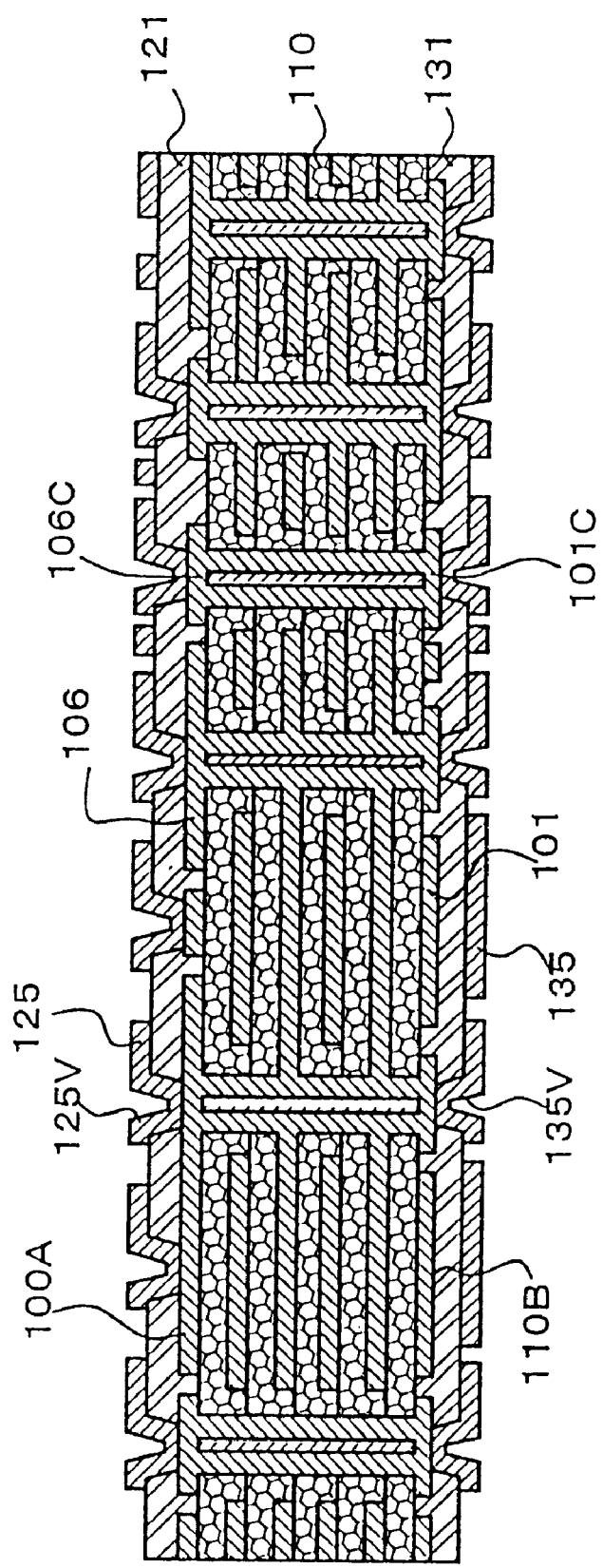

Next, a photosensitive epoxy resin film is affixed to the front and back surfaces 110A and 110B of the core substrate 110, followed by exposure and development to thereby form via holes in the films. Subsequently, the films are cured to become the insulating resin layers 121 and 131. Further, the wiring layers 125 and 135 of copper including the via conductors 125V and 135V, respectively, are formed by a semi-additive process (see FIG. 8).

Similarly, the insulating resin layers 141 and 151 and the wiring layers 145 and 155 including the via conductors 145V and 155V, respectively, are formed, followed by formation of the insulating resin layers 161 and 171 serving as solder resist. Thus is completed the printed wiring board 100 (see FIG. 2).

As described above, the present embodiment uses the three-layer film 10 and the patterned three-layer films 20 and 30 in fabrication of the laminate 50. There is no need for sequentially forming the composite dielectric layers 111–115 and the metal layers 101–106. Specifically, through use of the three-layer films 10 and the patterned three-layer films 20 and 30 to make up a required number of layers, a laminate can be formed at a time, thereby facilitating the fabrication of the core substrate 110. When the insulating resin layers 121 and the wiring layers 125 are to be formed on the front and back surfaces 110A and 110B of the core substrate 110, the core substrate 110 permits the use of conventional facilities and steps employed for the fabrication of a printed wiring board from a conventional core substrate even though the core substrate 110 has the laminated capacitor C1 incorporated therein. Thus, the printed wiring board 100 can be easily fabricated while the laminated capacitor C1 is incorporated therein.

Second Embodiment

Figure 9:
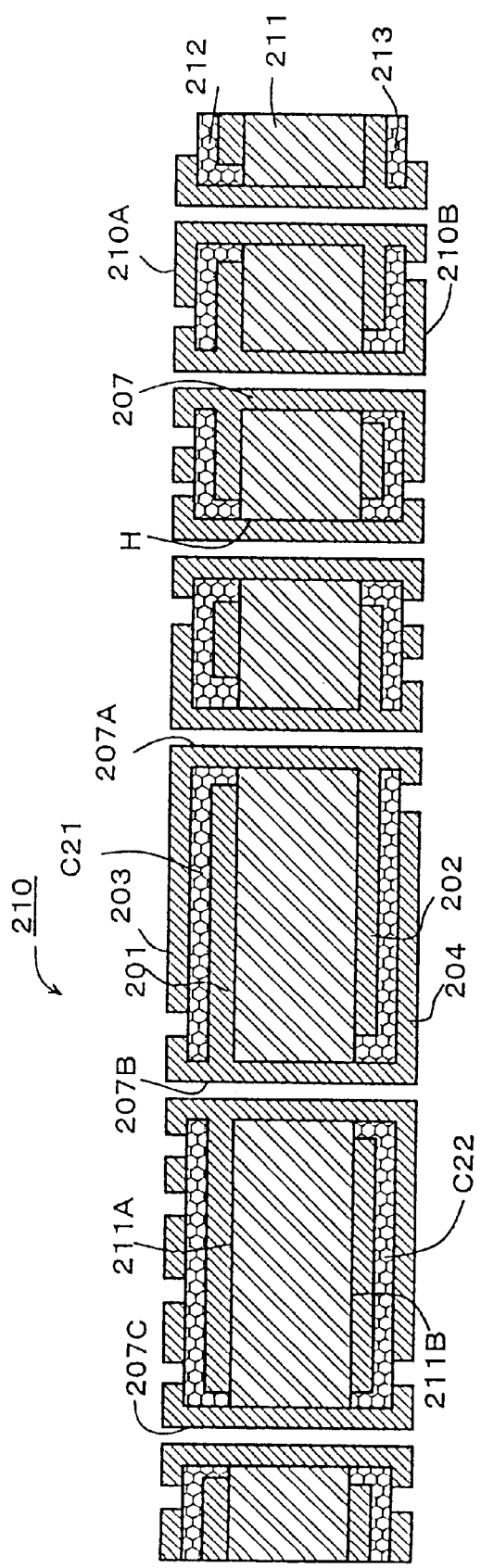
FIG. 9 is a partially enlarged sectional view showing a core substrate according to a second embodiment of the present invention.

A second embodiment of the present invention will next be described. As shown in FIG. 9, a core substrate 210 of the present embodiment is different from the core substrate 110 of the first embodiment in that the core substrate 210 includes a center substrate 211 and laminated capacitors formed on opposite sides of the center substrate 211. Thus, different portions will be mainly described while the description of the same portions will be omitted or simplified.

The core substrate 210 includes the center substrate 211 made of a glass-fiber-epoxy-resin composite material and having a thickness of 600 μm and laminated capacitors C21 and C22 formed respectively on front and back surfaces 211A and 211B of the center substrate 211. Specifically, the core substrate 210 includes the center substrate 211; composite dielectric layers 212 and 213, each having a thickness of 50 μm, made of a ceramic-metal-resin composite material, which is prepared through dispersion of 30 vol % $BaTiO_3$ and 20 vol % Cu powder into epoxy resin; metal layers 201 and 203 of Cu disposed such that the composite dielectric layer 212 is sandwiched therebetween, and metal layers 202 and 204 of Cu disposed such that the composite dielectric layer 213 is sandwiched therebetween; and through-hole conductors 207 of Cu formed on the respective walls of through holes H. The metal layers 201 and 203 and the composite dielectric layer 212 sandwiched therebetween constitute the laminated capacitor C21. The metal layers 202 and 204 and the composite dielectric layer 213 sandwiched therebetween constitute the laminated capacitor C22. The interior metal layer 201 is electrically connected to the metal layer 204 formed on the back core surface 210B by means of a second through-hole conductor 207B. The interior metal layer 202 is electrically connected to the metal layer 203 formed on the front core surface 210A by means of a first through-hole conductor 207A. The exterior metal layers 203 and 204 serve as electrodes of the laminated capacitors C21 and C22, respectively, and as wiring layers. Notably, a certain through-hole conductor 207, such as a third through-hole conductor 207C, is not electrically connected to the interior metal layers 201 and 202 so as to be used as, for example, a signal circuit line.

As in the case of the core substrate 110 of the first embodiment, the laminated capacitors C21 and C22 are incorporated in the core substrate 210, i.e., in a printed wiring board fabricated through formation of insulating resin layers and wiring layers on the core substrate 210. Accordingly, an IC chip (not shown) mounted on the printed wiring board is located in the vicinity of the laminated capacitor C21 or C22, thereby reliably eliminating noise. Through employment of the center substrate 211 made of a glass-fiber-epoxy-resin composite material, the mechanical strength of the core substrate 210 is increased, so that the core substrate 210 is resistant to deformation. Therefore, handling of the core substrate 210 is facilitated.

In the first embodiment, the laminated capacitor C1 includes the composite dielectric layers 111–115, which are formed of a composite material prepared through dispersion of $BaTiO_3$ powder and Cu powder into epoxy resin. However, part of constituent composite dielectric layers of a laminated capacitor may be formed of a material that does not contain high-permittivity powder, even though the capacitance of the resultant laminated capacitor decreases. For example, the composite dielectric layers 111 and 115 may be replaced with dielectric layers formed of a resin that does not contain $BaTiO_3$ powder or even contains neither $BaTiO_3$ powder nor Cu powder.

Next, a printed wiring board 200 will be described. As in the case of the first embodiment, the printed wiring board 200 shown in FIG. 10 includes the core substrate 210; three insulating resin layers 221, 241, and 261 and two wiring layers 225 and 245 formed on the front surface 210A of the core substrate 210; and three insulating resin layers 231, 251, and 271 and two wiring layers 235 and 255 formed on the back surface 210B of the core substrate 210. The wiring layers 225, 245, 235, and 255 are disposed between the insulating resin layers 221, 241, 261, 231, 251, and 271 and include via conductors 225V, 245V, 235V, and 255V, respectively. The through-hole conductors 207 formed in the core substrate 210 are filled with a plug material 216 of epoxy resin and are closed by means of block portions 203C and 204C formed on the metal layers 203 and 204, respectively.

The printed wiring board 200 also integrally contains the laminated capacitors C21 and C22. Accordingly, an IC chip (not shown) mounted on the printed wiring board surface 200A is located in the vicinity of the laminated capacitors C21 and C22, whereby connecting circuit lines for connecting the IC chip and the laminated capacitor C21 and C22 become very short, thereby reliably eliminating noise. As in the case of the first embodiment, the wiring layers 225, 245, 235, and 255 can have a conventional circuit line width and can be routed in a conventional manner. Thus, printed wiring layers including signal wiring layers can be designed easily.

Figure 2:
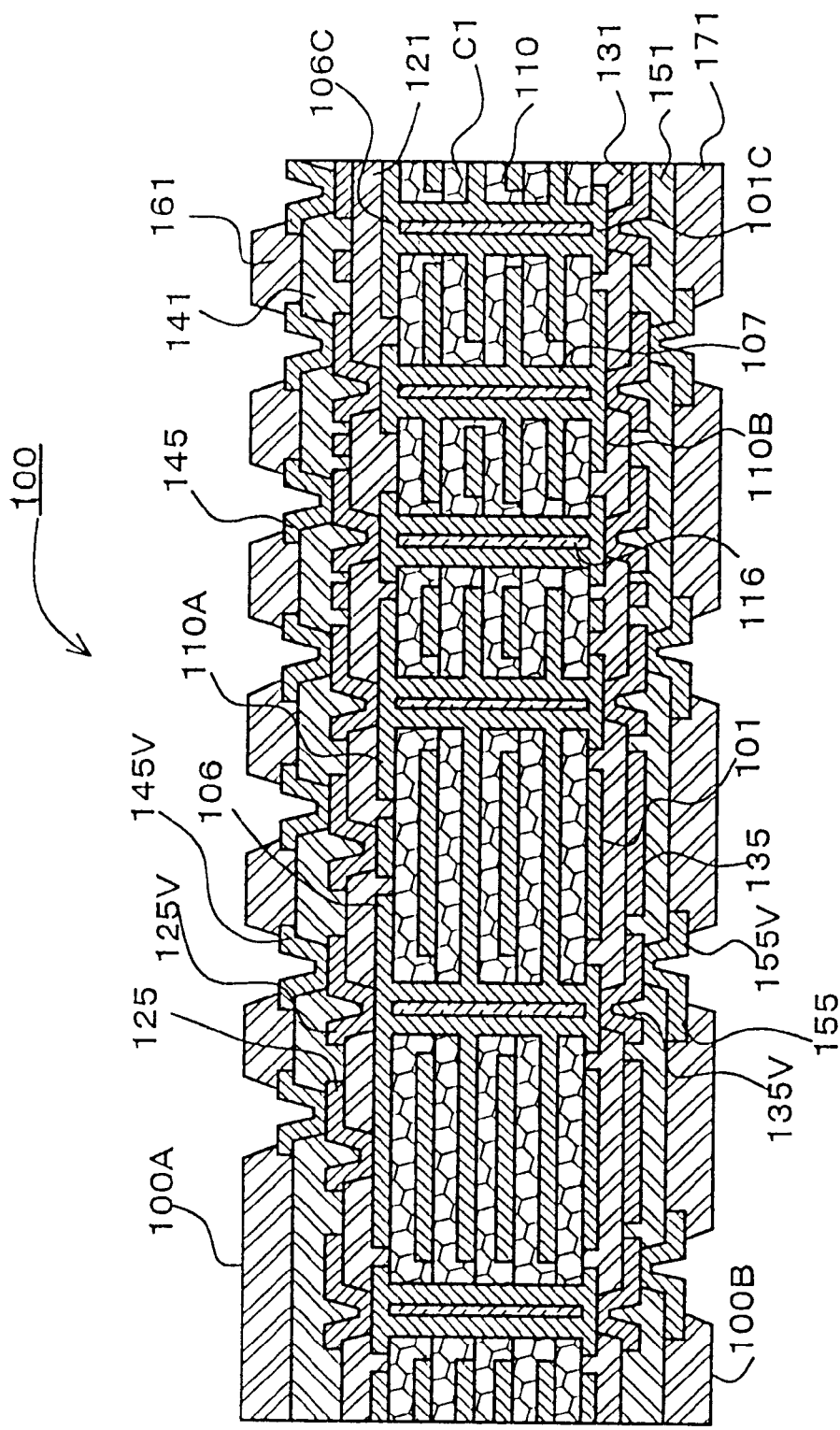
FIG. 2 is a partially enlarged sectional view showing a printed wiring board according to the first embodiment.
Figure 10:
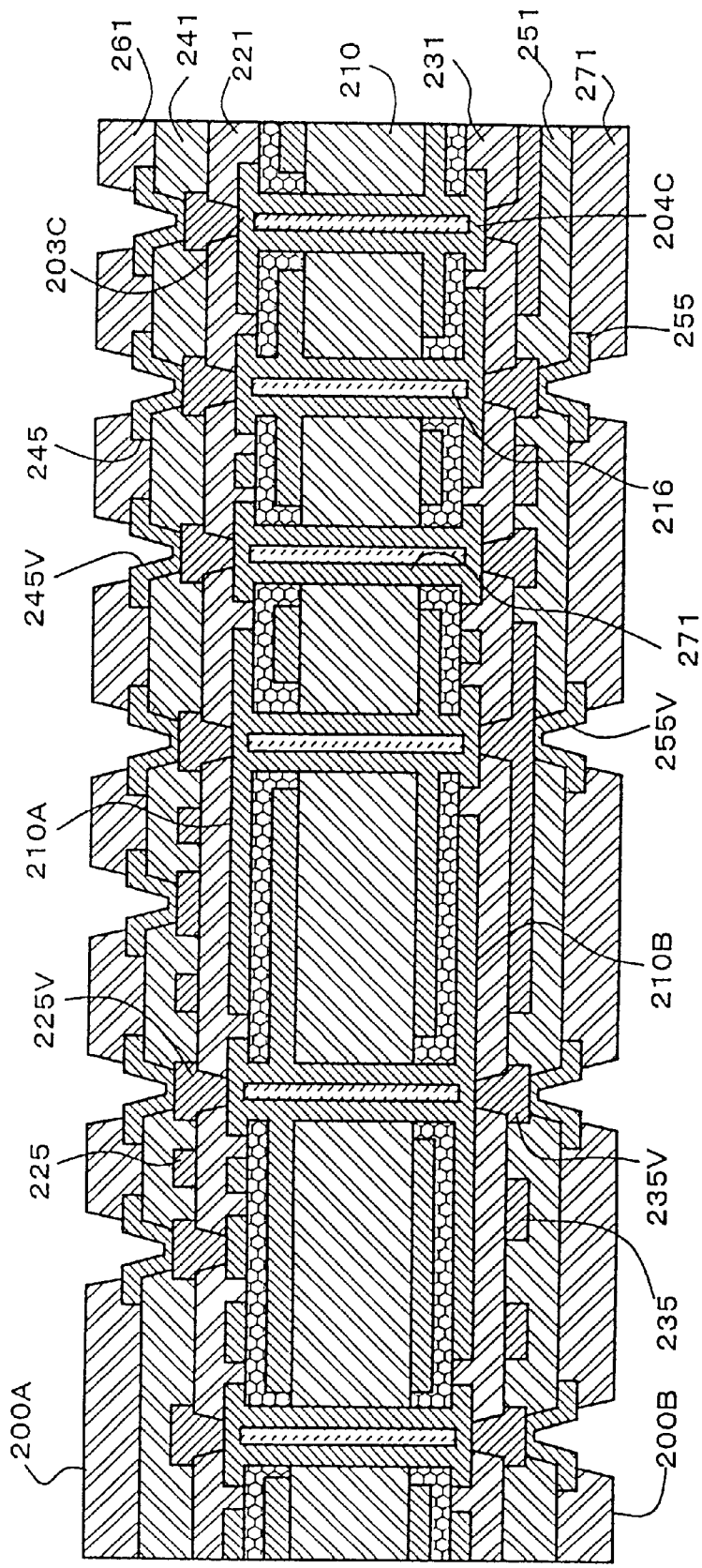
FIG. 10 is a partially enlarged sectional view showing a printed wiring board according to the second embodiment.

The first embodiment employs staggered via arrangement; i.e., the via conductors 125V, 145V, 135V, and 155V are arranged in a staggered manner (see FIG. 2). By contrast, as shown in FIG. 10, the printed wiring board 200 employs stacked via arrangement; i.e., the via conductors 225V and 245V are stacked and the via conductors 235V and 255V are stacked. Through employment of stacked via arrangement, circuit lines extending between the board surface 200A (200B) and the capacitor electrodes, i.e., the metal layers 201 (202) and 203 (204) can be rendered short. Further, in contrast to the case where dish-shaped via conductors are arranged in a staggered manner, the inner via conductors 225V and 235V are filled with conductor, whereby circuit lines can be rendered thick and thus can reduce resistance thereof. As a result, the inductance of the circuit lines becomes small, thereby suppressing entry of noise into the circuit lines.

Figure 11:
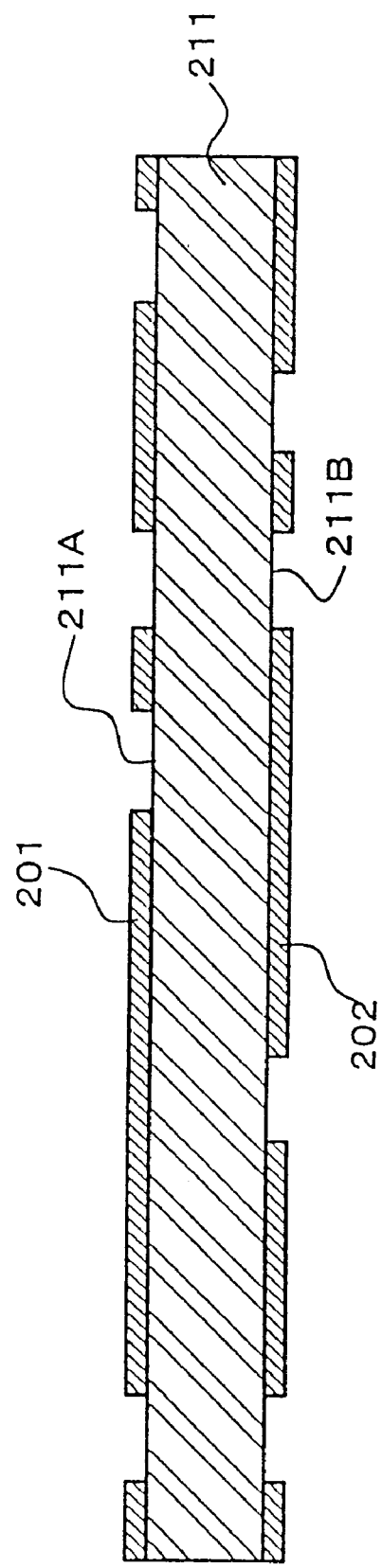
FIG. 11 is a partially enlarged sectional view showing a center substrate having metal layers of a predetermined pattern formed on opposite sides thereof.

Next, the method for fabricating the core substrate 210 will be described. A step of forming a three-layer film is the same as that of the first embodiment (see FIG. 3). As shown in FIG. 11, the metal layers 201 and 202 patterned as designed are formed previously on the front and back surfaces 211A and 211B of the center substrate 211.

Subsequently, in the step of forming a laminate, as shown in FIG. 12A, two-layer films 10C obtained through removal of the reinforcement films RF from the three-layer films 10 are placed on the center substrate 211 such that the metal layers 201 and 202 are brought into contact with the corresponding semi-cured composite dielectric layers 12. Then, the resultant laminar structure is thermally pressed in the vertical direction of FIG. 12A in a vacuum at a temperature of 180° C. and a pressure of 30 kg/cm² for 2 hours so as to cure epoxy resin of the composite dielectric layers 12, thereby yielding a laminate 60 shown in FIG. 12B. In the laminate 60, the metal layer 201 of a predetermined pattern, the composite dielectric layer 212, and the copper foil 11 are arranged in layers on the front surface 211A of the center substrate 211, while the metal layer 202 of a predetermined pattern, the composite dielectric layer 213, and the copper foil 11 are arranged in layers on the back surface 211B of the center substrate 211.

Figure 13:
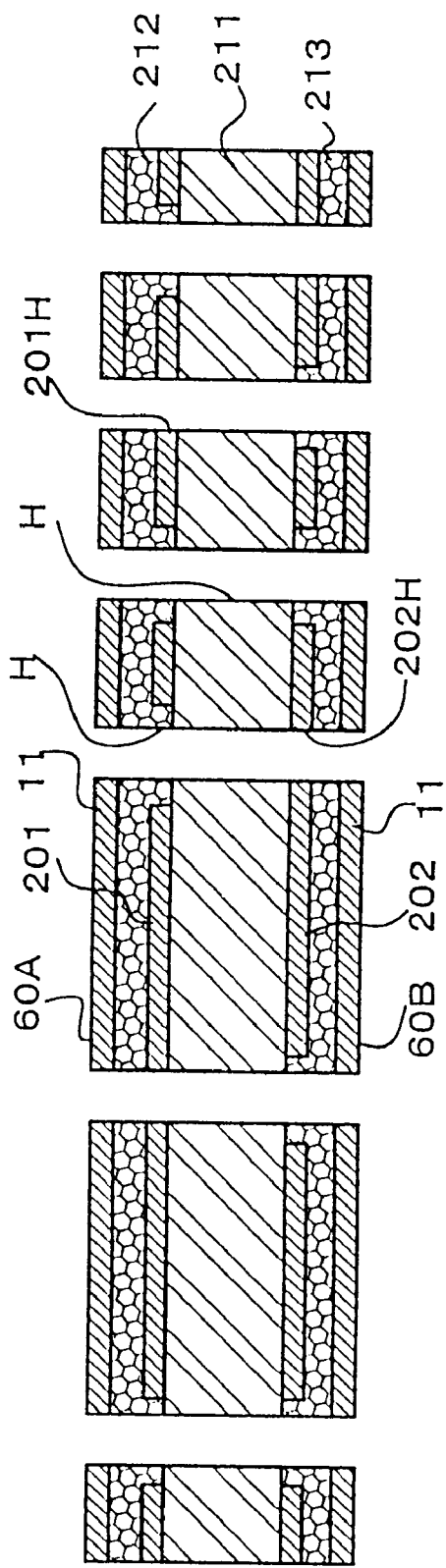

In the subsequent step of forming through-holes, as shown in FIG. 13, through-holes H having a diameter of 60 μm are formed in the laminate 60 at predetermined positions in such a manner as to extend between the front surface 60A and the back surface 60B, by use of a fourth harmonic of a YAG laser. End faces 201H and 202H of the metal layers 201 and 202 are exposed on the walls of some through-holes H.

In the step of forming a metal layer on the front and back surfaces 60A and 60B of the laminate 60, the through-hole conductors 207 are formed on the corresponding walls of the through-holes H by a known PTH process. Also, through utilization of the copper foils 11, the metal layers 203 and 204 patterned as designed are formed, thus completing the core substrate 210 (see FIG. 9). Notably, among the through-hole conductors 207, for example, the first and second through-hole conductors 207A and 207B are electrically connected to the end face 202H of the metal layer 202 and the end face 201H of the metal layer 201, respectively. Thus, as mentioned previously, electrical continuity is established between the metal layers 201 and 202 serving as opposite electrodes of the laminated capacitor and the metal layers 203 and 204 formed on the front and back surfaces 210A and 210B, respectively, via the first and second through-hole conductors 207A and 207B.

As in the case of the first embodiment, the core substrate 210 is inspected for a short circuit in and insulation resistance of or capacitance of the laminated capacitors C21 and C22. For example, when the laminated capacitor C21 (C22) suffers a short circuit caused by a short circuit between the metal layers 201 and 203 (202 and 204) or fails to exhibit a capacitance falling within a predetermined range, the core substrate 210 is disposed of as a defective core substrate. As in the case of the core substrate 110, a higher capacitance is preferred. Conceivable measures to increase the capacitance include the following: the thickness of the composite dielectric layers 212 and 213 is reduced; the area of the core substrate 210 is increased; and the metal powder (such as copper powder) content of the composite dielectric layers 212 and 213 is increased. However, these measures are likely to cause a short circuit in the laminated capacitor C21 (C22), potentially resulting in a reduced yield of the core substrates 210. The present embodiment enables the core substrate 210 to be checked for conditions of the laminated capacitors C21 and C22. If the laminated capacitor C21 (C22) is found defective, the bare core substrate 210 can be disposed of or otherwise discarded. Therefore, the printed wiring board 200 in process of, or after, fabrication is less likely to suffer a defective laminated capacitor C21 (C22), so that the fabrication of the printed wiring boards 200, which will be described later, is less likely to suffer a reduction in yield caused by occurrence of a defective laminated capacitor C21 (C22) and a loss caused by disposal of the printed wiring boards 200 having a defective laminated capacitor C21 (C22).

Figure 14:
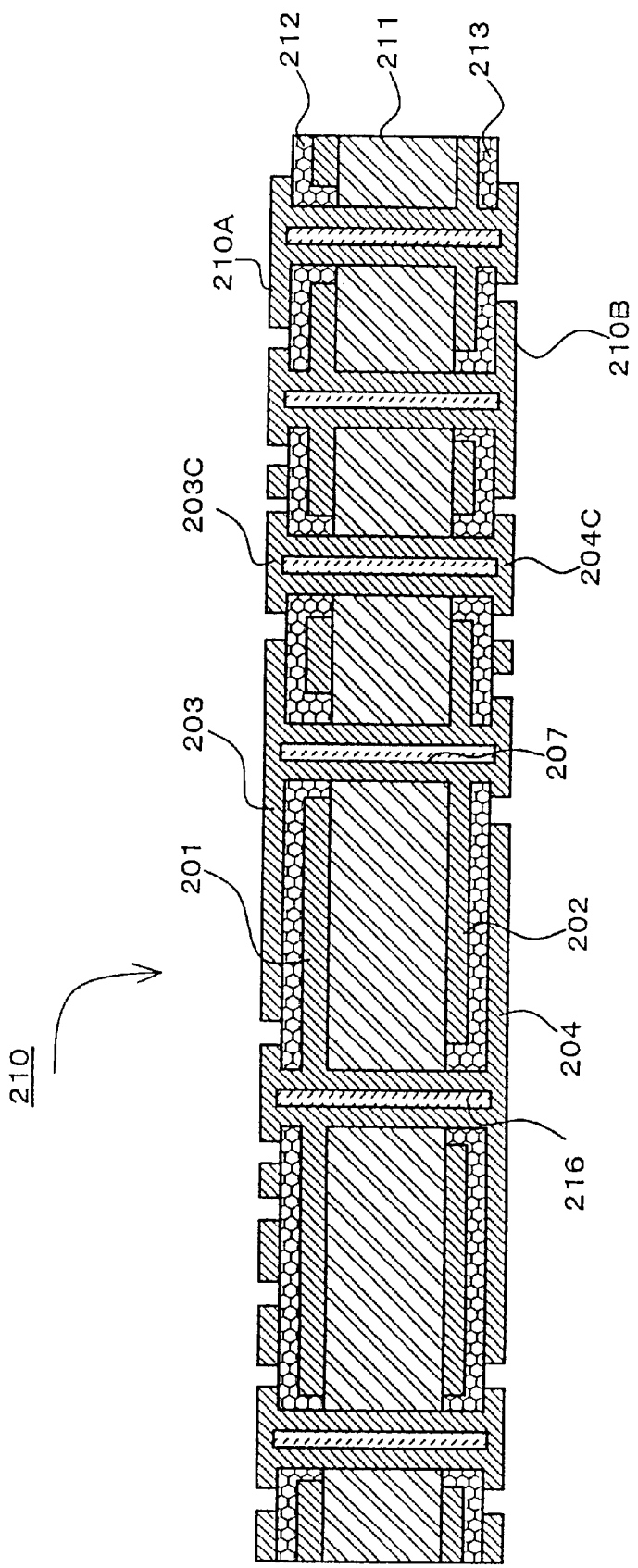

As in the case of the first embodiment, the core substrate 210 may be formed into the printed wiring board 200 by a known process. Specifically, as shown in FIG. 14, through-holes formed in the corresponding through-hole conductors 207 are filled with the plug material 216 of epoxy resin and are closed by the block portions 203C and 204C, which are formed by plating.

Figure 15:
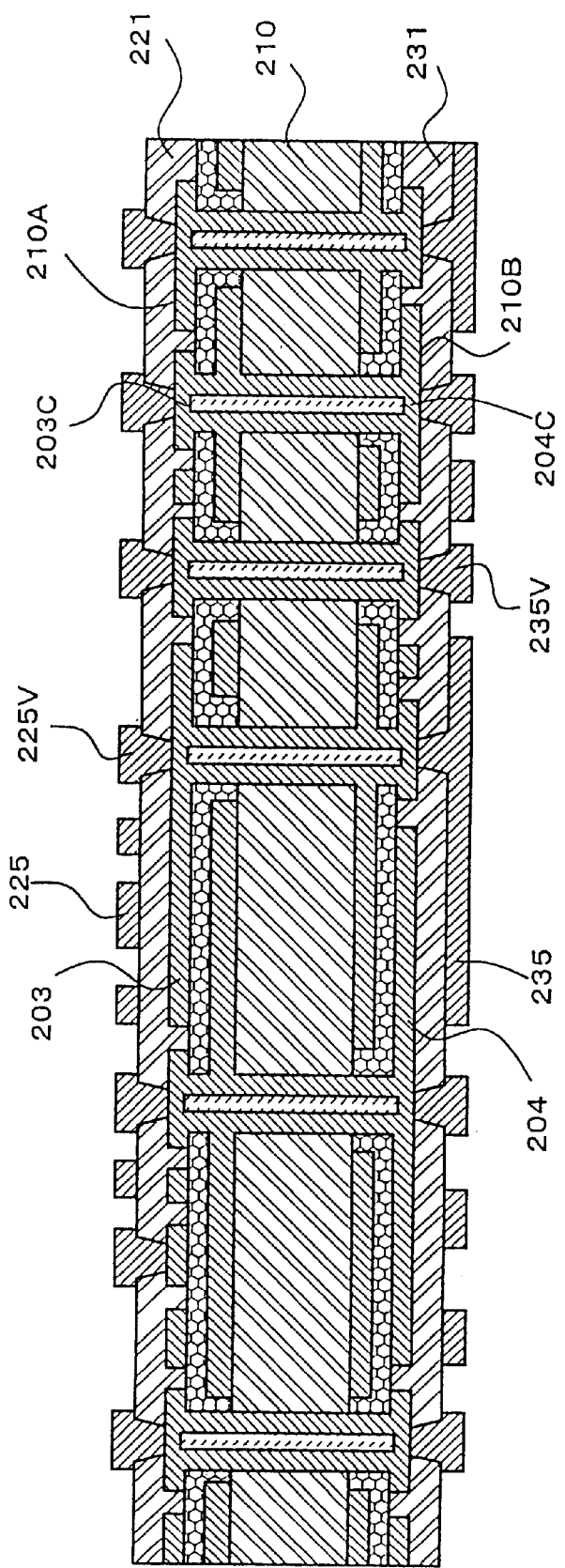

Next, as shown in FIG. 15, a photosensitive epoxy resin film is affixed to the front and back surfaces 210A and 210B of the core substrate 210, followed by exposure and development to thereby form via holes in the films. Subsequently, the films are cured to become the insulating resin layers 221 and 231. Further, the wiring layers 225 and 235 of copper including the via conductors 225V and 235V, respectively, are formed by a semi-additive process.

Similarly, the insulating resin layers 241 and 251 and the wiring layers 245 and 255 including the via conductors 245V and 255V, respectively, are formed, followed by formation of the insulating resin layers 261 and 271 serving as solder resist. Thus is completed the printed wiring board 200 (see FIG. 10).

According to the present embodiment, the laminated capacitor C21—which is composed of the metal layers 201 and 203 and the composite dielectric layer 212—is formed on the front surface 211A of the center substrate 211, while the laminated capacitor C22—which is composed of the metal layers 202 and 204 and the composite dielectric layer 213—is formed on the back surface 211B. However, a laminated capacitor may be formed only on either the front or back surface according to circumstances, for example, when a required capacitance is small.

Figure 16:
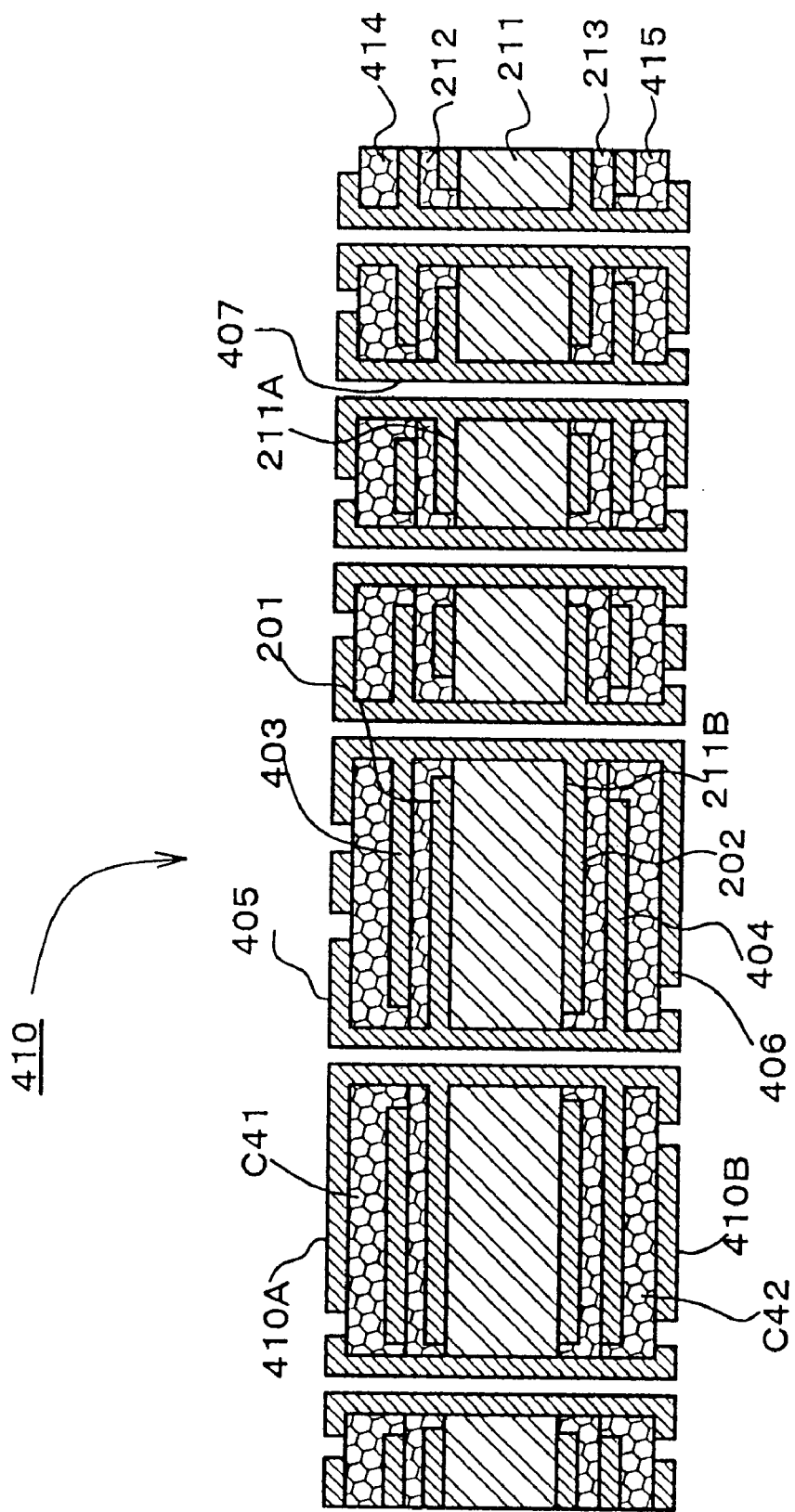
FIG. 16 is a partially enlarged sectional view showing a core substrate according to a modification of the second embodiment.
Figure 17:
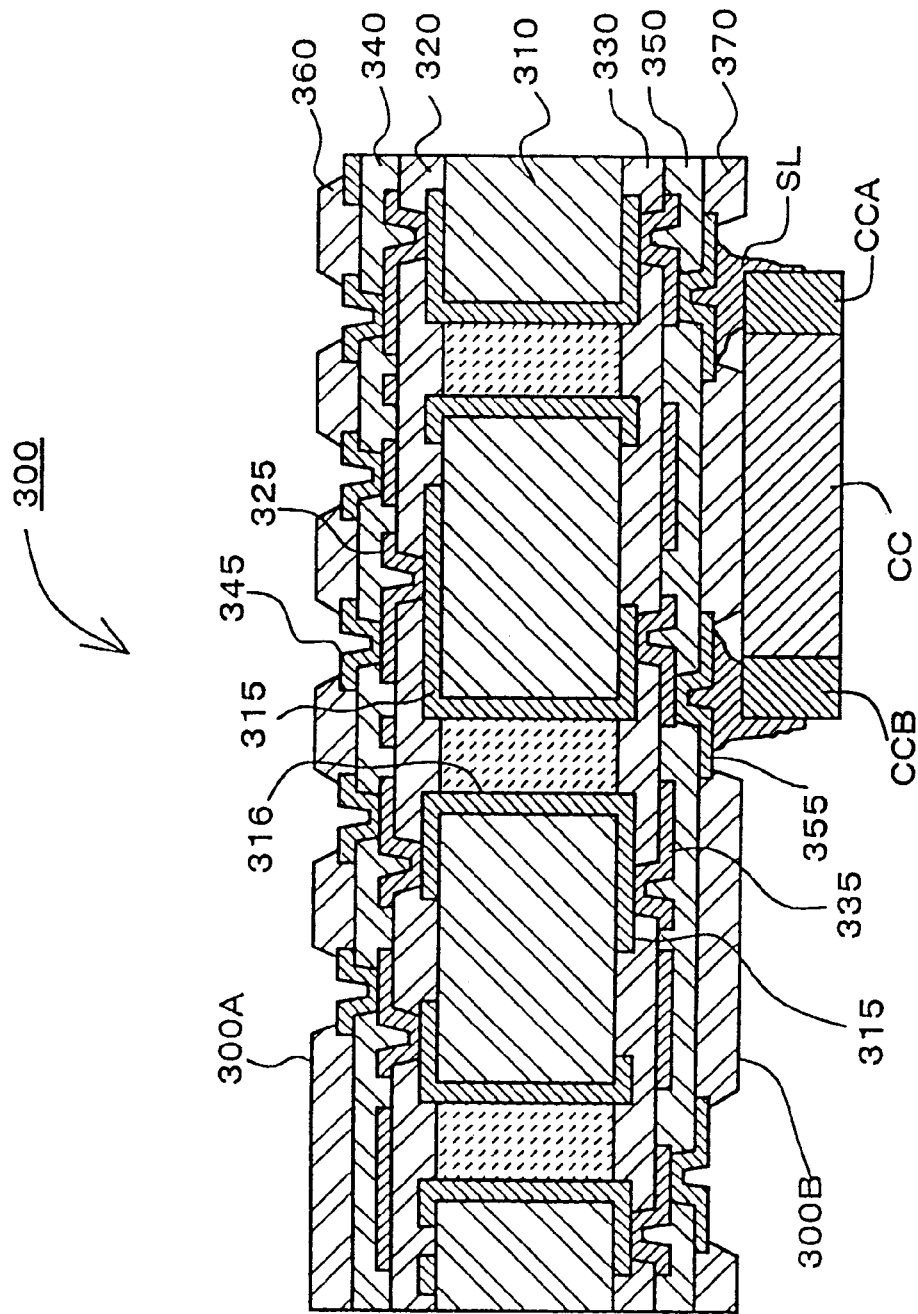
FIG. 17 is a partially enlarged sectional view showing a conventional wiring board having a chip capacitor mounted on a bottom side thereof.

By contrast, when a required capacitance is large, the core substrate 210 may be modified such that a laminated capacitor formed on the front and back surfaces of the center substrate includes a plurality of composite dielectric layers and a plurality of metal layers, which are arranged alternatingly in layers, while some of the metal layers are electrically interconnected by means of through-hole conductors. For example, a core substrate 410 shown in FIG. 16 includes the center substrate 211; a laminated capacitor C41; and a laminated capacitor C42. The laminated capacitor C41 (C42) includes two composite dielectric layers 212 and 414 (213 and 415) and three metal layers 201, 403, and 405 (202, 404, and 406), which are arranged alternatingly in layers. Some of the metal layers are electrically interconnected by means of through-hole conductors 407.

The core substrate 410 is fabricated in the following manner. The three-layer films 10 shown in FIG. 3B and the patterned three-layer films 20 and 30 shown in FIGS. 4B and 4C, respectively, are prepared in advance. Two-layer films obtained through removal of the reinforcement films RF from the patterned three-layer films 20 and 30 are placed on the metal layers 201 and 202, which are formed previously on the front and back surfaces 211A and 211B of the center substrate 211. Subsequently, on opposite sides of the resultant laminar structure, a two-layer film obtained through removal of the reinforcement film RF from the three-layer film 10 is placed. The laminar structure is then thermally pressed to thereby yield a laminate. The laminate undergoes processing similar to that of the second embodiment, yielding a printed wiring board.

As described above, also in the present embodiment (its modified embodiment), there is no need for sequentially forming the composite dielectric layers 212 and 213 (212, 213, 414, and 415) and the metal layers 201–204 (201, 202, and 403–406). Specifically, through use of the three-layer films 10 and the patterned three-layer films 20 and 30 to make up a required number of layers, a laminate can be formed at a time, thereby facilitating the fabrication of the core substrate 210 (410). When the insulating resin layers and the wiring layers are to be formed on the front and back surfaces 210A and 210B (410A and 410B) of the core substrate 210 (410), the core substrate 210 (410) permits the use of conventional facilities and steps employed for the fabrication of a printed wiring board from a conventional core substrate even though the core substrate 210 (410) has the laminated capacitors C21 and C22 (C41 and C42) incorporated therein. Thus, the printed wiring board 200, for example, can be easily fabricated while the laminated capacitors C21 and C22 are incorporated therein.

Although the embodiments of the present invention have been described above, it will be understood that the invention is not limited thereto and may be changed or modified without departing from the scope of the invention.

For example, the first embodiment has been described while mentioning the core substrate 110 that includes five composite dielectric layers. However, the number of the composite dielectric layers may be modified as adequate according to a required capacitance. An epoxy resin that contains $BaTiO_3$ powder and Cu powder in a dispersed form is used as material for the composite dielectric layers. However, other high-permittivity powder and metal powder may be used.

In the above-described embodiments, the two-layer film 10C and the patterned two-layer films 20C and 30C are superposed directly on one another to thereby form a laminate. However, a adhesive layer may be interposed therebetween through application of a adhesive made of, for example, epoxy resin or through placement of a adhesive film. The resultant laminar structure may be thermally pressed to thereby form a laminate. The thus-obtained laminate enjoys reliable adhesion between the composite dielectric layers and the metal layers.

What is claimed is:

1. A printed wiring board comprising a core substrate having sides, at least one insulating resin layer laminated on at least one side of the core substrate, and a wiring layer formed at least between (i) the core substrate and the at least one insulating resin layer or between (ii) two insulating resin layers, wherein said at least one insulating resin layer comprises a plurality of insulating resin layers; the core substrate comprising:
   a composite dielectric layer containing resin and a high-permittivity powder; and
   a plurality of metal layers disposed so as to sandwich the composite dielectric layer therebetween to thereby form a laminated capacitor, the high-permittivity powder contained in the composite dielectric layer comprising a powder of a material selected from the group consisting of $BaTiO_3$, $PbTiO_3$, $PbZrO_3$, $Pb(Ti, Zr)O_3$, $Pb(Mn, Nb)O_3$, $SrTiO_3$, and $MgTiO_3$, and the composite dielectric layer further containing a metal powder selected from the group consisting of Ag, Au, Cu, Ag—Pd, Ni, W, and Mo.

2. A printed wiring board according to claim 1, wherein the core substrate includes at least one through-hole partially filled with a through-hole conductor such that the through-hole conductor is electrically connected to the metal layers other than a metal layer located on the surface of the core substrate.

3. A printed wiring board according to claim 1, wherein the resin contained in the composite dielectric layer is selected from the group consisting of epoxy resin, polyimide resin, and BT resin.

4. A core substrate for use in fabricating a printed wiring board through lamination of at least one insulating resin layer and wiring layer on at least one side of the core substrate, the core substrate comprising:

at least one composite dielectric layer containing resin and high-permittivity powder; and a plurality of metal layers disposed so as to sandwich the composite dielectric layer therebetween to thereby form a laminated capacitor, said high-permittivity powder contained in the composite dielectric layer comprising a powder of a material selected from the group consisting of $BaTiO_3$, $PbTiO_3$, $PbZrO_3$, $Pb(Ti, Zr)O_3$, $Pb(Mn, Nb)O_3$, $SrTiO_3$, $CaTiO_3$, and $MgTiO_3$, and the composite dielectric layer further containing a metal powder selected from the group consisting of Ag, Au, Cu, Ag—Pd, Ni, W, and Mo.

5. A core substrate according to claim 4, wherein the core substrate includes at least one through-hole partially filled with a through-hole conductor such that the through-hole conductor is electrically connected to the metal layers other than a metal layer located on the surface of the core substrate.

6. A core substrate according to claim 4, wherein the resin contained in the composite dielectric layer is selected from the group consisting of epoxy resin, polyimide resin, and BT resin.

7. A core substrate for use in fabricating a printed wiring board through lamination of at least one insulating resin layer and wiring layer on at least one side of the core substrate, the core substrate comprising:

a center substrate;

at least one composite dielectric layer containing resin and a high-permittivity powder; and a plurality of metal layers disposed so as to sandwich the composite dielectric layer therebetween to thereby form a laminated capacitor on at least one side of the center substrate, the high-permittivity powder contained in the composite dielectric layer comprising a powder of a material selected from the group consisting of $BaTiO_3$, $PbTiO_3$, $PbZrO_3$, $Pb(Ti, Zr)O_3$, $Pb(Mn, Nb)O_3$, $SrTiO_3$, $CaTiO_3$, and $MgTiO_3$, and the composite dielectric layer further containing a metal powder selected from the group consisting of Ag, Au, Cu, Ag—Pd, Ni, W, and Mo.

8. A core substrate according to claim 7, wherein the center substrate is formed of a material selected from the group consisting of a glass-fiber-resin composite material composed of glass fiber and resin; a composite material composed of resin and organic fiber; and a resin-resin composite material formed through impregnation of a three-dimensional network fluorine resin with resin.

9. A core substrate according to claim 7, wherein the core substrate includes at least one through-hole partially filled with a through-hole conductor such that the through-hole conductor is electrically connected to the metal layers other than a metal layer located on the surface of the core substrate.

10. A core substrate according to claim 7, wherein the resin contained in the composite dielectric layer is selected from the group consisting of epoxy resin, polyimide resin, and BT resin.

* * * * *